(12) United States Patent
Chakraborty et al.

(10) Patent No.: US 9,692,428 B2
(45) Date of Patent: Jun. 27, 2017

(54) SELF-CALIBRATING SHARED-COMPONENT DUAL SYNTHESIZER

(71) Applicants: Texas Instruments Incorporated, Dallas, TX (US); Texas Instruments Deutschland GmbH, Freising (DE)

(72) Inventors: Sudipto Chakraborty, Richardson, TX (US); Jens Graul, Freising (DE)

(73) Assignees: TEXAS INSTRUMENTS INCORPORATED, Dallas, TX (US); TEXAS INSTRUMENTS DEUTSCHLAND GMBH, Freising (DE)

( * ) Notice: Subject to any disclaimer, the term of this patent is extended or adjusted under 35 U.S.C. 154(b) by 108 days.

(21) Appl. No.: 14/137,366

(22) Filed: Dec. 20, 2013

(65) Prior Publication Data

US 2015/0180594 A1 Jun. 25, 2015

(51) Int. Cl.
*H03L 7/08* (2006.01)
*H03L 7/18* (2006.01)
*H03L 7/099* (2006.01)
*H03L 7/089* (2006.01)
*H03L 7/23* (2006.01)
*H03L 7/10* (2006.01)
*H04B 1/403* (2015.01)
*H04B 1/408* (2015.01)
*H04B 1/50* (2006.01)

(52) U.S. Cl.
CPC .......... *H03L 7/0802* (2013.01); *H03L 7/0891* (2013.01); *H03L 7/099* (2013.01); *H03L 7/104* (2013.01); *H03L 7/18* (2013.01); *H03L 7/235* (2013.01); *H04B 1/403* (2013.01); *H04B 1/408* (2013.01); *H04B 1/50* (2013.01)

(58) Field of Classification Search
CPC combination set(s) only.
See application file for complete search history.

(56) References Cited

U.S. PATENT DOCUMENTS

| 5,787,126 | A | * | 7/1998 | Itoh | H03D 7/165 329/306 |
|---|---|---|---|---|---|
| 6,112,068 | A | * | 8/2000 | Smith | H03L 7/0891 455/230 |
| 6,396,890 | B1 | * | 5/2002 | Turner | H03L 7/146 327/156 |
| 6,484,014 | B1 | * | 11/2002 | Koszarsky | H04B 1/406 455/260 |

(Continued)

*Primary Examiner* — Ankur Jain
*Assistant Examiner* — Zhitong Chen
(74) *Attorney, Agent, or Firm* — John R. Pessetto; Charles A. Brill; Frank D. Cimino

(57) ABSTRACT

A self-calibrating shared-component dual synthesizer includes, for example, two frequency synthesizers that are adapted to operate (respectively) in transmit (TX) and receive (RX) modes. Each synthesizer can be selectively arranged to vary and optimize the phase noise in accordance with the TX and RX requirements associated with each mode as well as independently optimized for flexible low area floorplan to achieve low power, spectral fidelity and reduced test time, low cost built in self-calibration. The two frequency synthesizers are also adapted to provide a built-in self-test signals used for intermodulation testing and calibration.

8 Claims, 6 Drawing Sheets

(56) References Cited

U.S. PATENT DOCUMENTS

| | | | |
|---|---|---|---|
| 6,515,553 B1* | 2/2003 | Filiol | H03C 3/0925 |
| | | | 332/127 |
| 2003/0119474 A1* | 6/2003 | Kimura | H04B 1/30 |
| | | | 455/333 |
| 2003/0137359 A1* | 7/2003 | Patana | H03L 7/1978 |
| | | | 331/100 |
| 2005/0012555 A1* | 1/2005 | Nord | H03L 7/1806 |
| | | | 331/16 |
| 2007/0202832 A1* | 8/2007 | Takikawa | H04B 1/40 |
| | | | 455/333 |

\* cited by examiner

SELF-CALIBRATING SHARED-COMPONENT DUAL SYNTHESIZER

BACKGROUND

Modern electronic systems such as radio-enabled systems often have low power dissipation requirements while operating in transmit and/or receive modes. These systems also often require a self-testing and self-calibration capability that is cost effective. To save cost, the substrate area of an integrated circuit (IC) used to implement a self-test and self-calibration capability for a radio device such as a transceiver is often minimized by using as single frequency synthesizer from which receive and transmit clock signals are derived. Such an approach often requires complicated clock distribution schemes that consume relatively large amounts of power and that use additional buffers, which significantly degrades the dynamic range of the system.

In products that have the need to perform built-in self-calibration (BISC) of various parameters of the receiver, a lower-performance oscillator can be included on the substrate circuitry in order to save area of the substrate that would otherwise be required to implement a higher-performance oscillator. However, the low performance oscillator can significantly impact the BISC accuracy due to the low fidelity of the low-performance oscillator. At the same time, any BISC technique should consume minimum additional area to be implemented in silicon to reduce any additional costs.

SUMMARY

The problems noted above can be solved in large part by a dual synthesizer having shared components which, for example, provides a cost-effective solution for reducing substrate area and power requirements of an integrated circuit in which the dual synthesizer transceiver is formed. A dual synthesizer having shared components system includes two separate frequency synthesizers that have at least one shared low frequency generation component that is shared between the two separate frequency synthesizers. The two frequency synthesizers are adapted to operate (respectively) in transmit (TX) and receive (RX) modes and can be arranged to optimize the phase noise differently in accordance with the TX and RX requirements associated with each mode. The two frequency synthesizers are also adapted to provide built-in self-test signals used for intermodulation testing and calibration, including tuning of various high frequency selective impedance points, as well as low frequency analog baseband signal processing blocks (such as filters and amplifiers etc.), thus leading to a high sensitivity and high selectivity receiver implementation at minimum additional cost.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and thus are to be interpreted to mean "including, but not limited to . . . . " Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "calibration" can include the meaning of the word "test."

Figure 1:
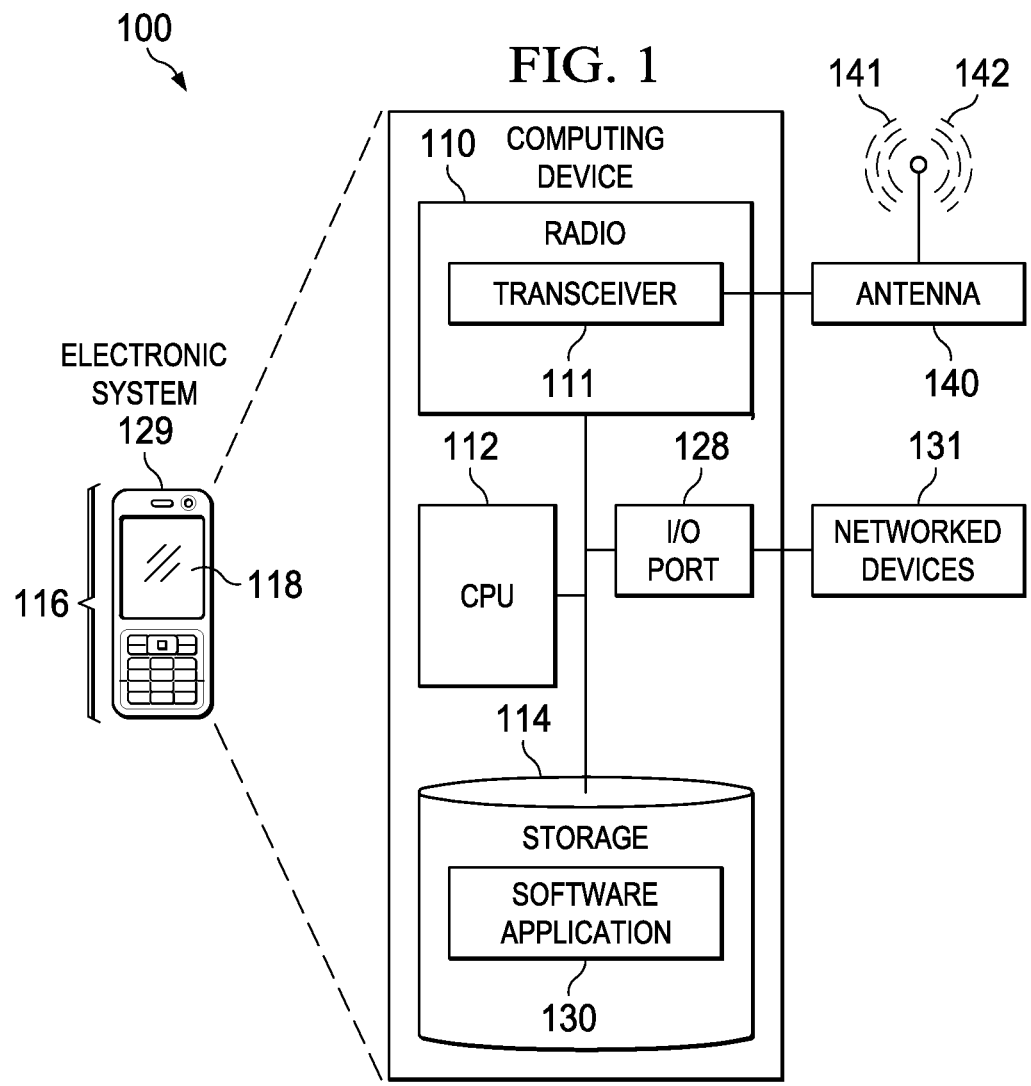
FIG. 1 shows an illustrative electronic device in accordance with example embodiments of the disclosure.

FIG. 1 shows an illustrative computing device 100 in accordance with preferred embodiments of the disclosure. For example, the computing device 100 is, or is incorporated into, an electronic system 129, such as a mobile device, a cellular phone, a personal digital assistant, a personal computer, electronics control "box" or display, a two-way radio, or any other type of electronic system. The computing device 100 can be powered from line current, solar cell, and/or battery (or capacitive) storage.

In some embodiments, the computing device 100 comprises a megacell or a system-on-chip (SoC) which includes control logic such as a CPU 112 (Central Processing Unit), a storage 114 (e.g., random access memory (RAM)) and a radio 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The radio 110 includes a monitoring system and comprises logic and functionality (embodied at least partially in hardware) that supports monitoring, testing, and debugging of the transceiver 111 executing the software application 130. For example, the radio 110 can emulate one or more defective or unavailable components of the transceiver 111 to allow verification of how the component(s), were it actually functional on the transceiver 111, would perform in various situations (e.g., how the components would interact with the software application 130). In this way, the transceiver 111 can be debugged in an environment which resembles post-production operation.

The radio 110 includes a transceiver 111 that is used, for example, for transmitting and receiving encoded radio frequency (RF) signals. As discussed below, the transceiver 111 includes two separate frequency synthesizers that have at least one shared low frequency generation component between the two separate frequency synthesizers. The two frequency synthesizers are used (respectively) for transmit (TX) and receive (RX) modes and can be arranged to optimize the phase noise differently in accordance with the TX spectral mask for out-of-band emission, and RX selectivity requirements for blockers associated with each mode.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like. The CPU 112 and radio 110 is coupled to I/O (Input-Output) port 128, which provides an interface that is configured to receive input from (and/or provide output to) networked devices 131. The networked devices 131 can include any device (including test equipment) capable of point-to-point and/or networked communications with the computing device 100. The computing device 100 can also be coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 can be accessed by, for example, by the networked devices 131.

The computing device 100 includes a networking device such as transceiver 111 that is arranged to transmit and receive encoded radio frequency (RF) signals. Transceiver 111 is coupled to antenna 140 that can be used to transmit a modulated signal 142 to, e.g., another radio 110 and receive a modulated signal 141 that is transmitted by, e.g., another radio 110). The modulated signal is broadcast wirelessly and received by a RF receiver (e.g., of the other radio 110). The antenna 140 can be arranged in a separate assembly from (or the same assembly of) the radio 110.

In various example embodiments, transceiver 111 is arranged to communicate wirelessly. The wireless transmissions can include transmission and reception of data packets over a cellular network. As disclosed herein with respect to the following Figures, the radio 110 and/or the transceiver 111 includes dual frequency synthesizers (having at a portion of a feedback loop in common) that are arranged to, for example, test and/or calibrate the transceiver 111. The transceiver 111 can be configured to be compatible with multiple wireless and/or radio communications.

Figure 2:
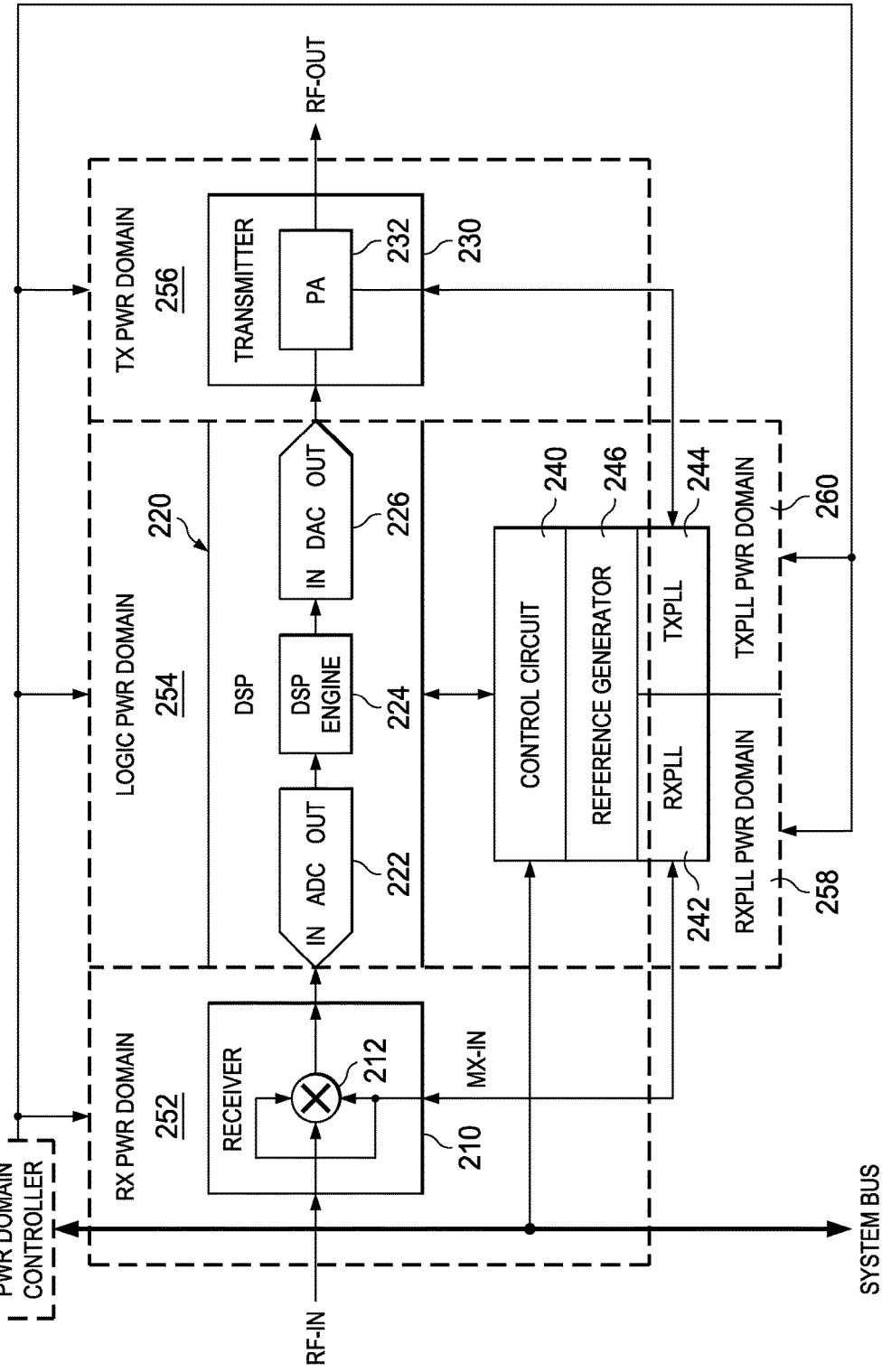
FIG. 2 is a block diagram illustrating a radio having dual frequency synthesizers that have at least one common low frequency generation component in accordance with example embodiments of the disclosure.

FIG. 2 is a block diagram illustrating a radio having dual frequency synthesizers that have at least one common low frequency generation component in accordance with example embodiments of the disclosure. Generally described, the radio 200 includes a receiver 210, a DSP such as baseband/low frequency signal processing elements 220, and transmitter 230 that are used to receive and process a received radio signal and to generate and transmit a generated radio signal. The receiver 210 is arranged, for example, to receive an input radio-frequency signal (e.g., RF-IN) and demodulate the signal at mixer 212 using quadrature signals received from the receive phase lock loop (PLL) 242 (as discussed below). The demodulated signal can be coupled to the baseband/low frequency signal processing elements 220, for example, to extract encoded information from the demodulated signal. Accordingly, a receive signal path for received signals can be calibrated using the receiver 210, the baseband/low frequency signal processing elements 220, the transmitter 230, and (as well as at least) PLL 242.

The baseband/low frequency signal processing elements 220 includes an analog-to-digital (ADC) converter 222, a DSP engine 224, and a digital-to-analog (DAC) 226. In operation (such as during test, calibration, and/or normal operation), the ADC 222 is arranged to digitize the received input signal (RF-IN) and to provide an indication of the input signal by generating a series of digitally coded values that correspond to the magnitude of the input signal at each sampling time. The DSP engine 224 is arranged to receive the series of digitally coded values and, for example, to extract encoded information (e.g., by performing a spectral analysis such as those based on Fourier transforms) from the demodulated signal. The DSP engine 224 is further arranged to generate and to encode information for transmitting. For example, the transmitter 230 is arranged to transmit the encoded information using the output signal (RF-OUT) via power amplifier (PA) 232. The output signal RF-OUT is transmitted using a frequency that is generated by a transmit phase look loop 244 (in either open or closed loop configuration, as discussed below).

A control circuit 240 (operating independently of or in conjunction with the baseband/low frequency signal processing elements 220) is arranged to place the radio 200 in various modes such as a receive mode, a transmit mode, a receive test mode, and a transmit test mode. In response to an indication of a particular mode being active (e.g., a system command that is received via a system bus), the control circuit 240 is arranged to control the elements of one or both of the dual frequency synthesizers.

In the illustrated embodiment, a first frequency synthesizer includes a receive phase lock loop (RXPLL) 242 and a second frequency synthesizer includes a transmit phase lock loop (TXPLL) 244. Both the RXPLL 242 and the TXPLL 244 operate at RF frequencies that are typically required by the transmitter 230 and receiver 210. For example, both the RXPLL 242 and the TXPLL 244 are fractional-N-type synthesizers, which allow the radio 200 to operate in accordance with the relatively narrow channel spacing of wireless standards. The output of RXPLL 242 can be used to drive quadrature inputs of a mixer 212 in receiver 210, while the output (e.g., a differential signal) of TXPLL 244 can be used to drive the input of a power amplifier 232 in transmitter 230. This architecture configuration, for example, can potentially eliminate the requirement of placing a high speed divider in the TX signal processing path and allows for resonating the large capacitive load of the transmitter PA 232 blocks using the resonator of a voltage controlled oscillator, which leads to a lowest power implementation for the transmitter. For example, the output of TXVCO 332 (discussed below with respect to FIG. 3) of TXPLL 244 can be directly coupled to the transmitter PA 232, which saves power that would otherwise be consumed by a high frequency divider in a block having high frequency components.

A reference generator 246 includes a common feedback portion of a circuit that is shared between the RXPLL 242 and the TXPLL 244. The common feedback portion (which includes at least one shared component that is shared between RXPLL 242 and the TXPLL 244) allows the RXPLL 242 and the TXPLL 244 to be simultaneously laid out in a substrate in a substantially smaller (e.g., at least 10 percent smaller) area than the area that would otherwise be required if the RXPLL 242 and the TXPLL 244 were to be laid out without a shared common portion. Laying out the RXPLL 242 and the TXPLL 244 having a shared common portion helps realize compact-area floorplans for lower power transmitting and receiving because the RXPLL 242 and the TXPLL 244 operate using separate center frequencies in a time division duplex (TDD) fashion (such as one oscillator is on at a time for normal TX/RX operation, while both may be selectively and simultaneously functional for calibration). Thus, the dual synthesizer system allows for lower power RX, lower power TX, and yet allow for a wide variety of self-calibration capabilities, all within the same IC environment.

The power domain controller 250 is arranged to selectively apply power to various components within radio 200 in response to changes in an operating mode. Generally, selected components can be powered up (or down) when the function supplied is needed (or no longer needed). Power domain controller 250 is arranged to selectively apply power to the receiver power domain (RX PWR DOMAIN) 252, the logic power domain (LOGIC PWR DOMAIN) 254, the transmitter power domain (TX PWER DOMAIN) 256, the receiver PLL power domain (RXPLL PWR DOMAIN) 258, and the transmitter PLL power domain (TXPLL PWR DOMAIN) 260.

While each of the "power domains" is generally illustrated as being associated with a functional block in the Figure, it is understood that the delineated boundaries are approximate and that some subcomponents within a designated power domain (such as control logic) may remain powered up, even as other components (such as analog components) might be powered down. For example, analog parts of a digital-to-analog controller or a PLL VCO might be powered while state or control circuitry (that is digital) might remain powered up. Thus, the boundaries of a power domain are generally illustrated and are not necessarily delineated by components of a functional block. Also, the use of different supply domains also helps to increase noise isolation with respect to isolating electrical noise from one block to another.

Figure 3:
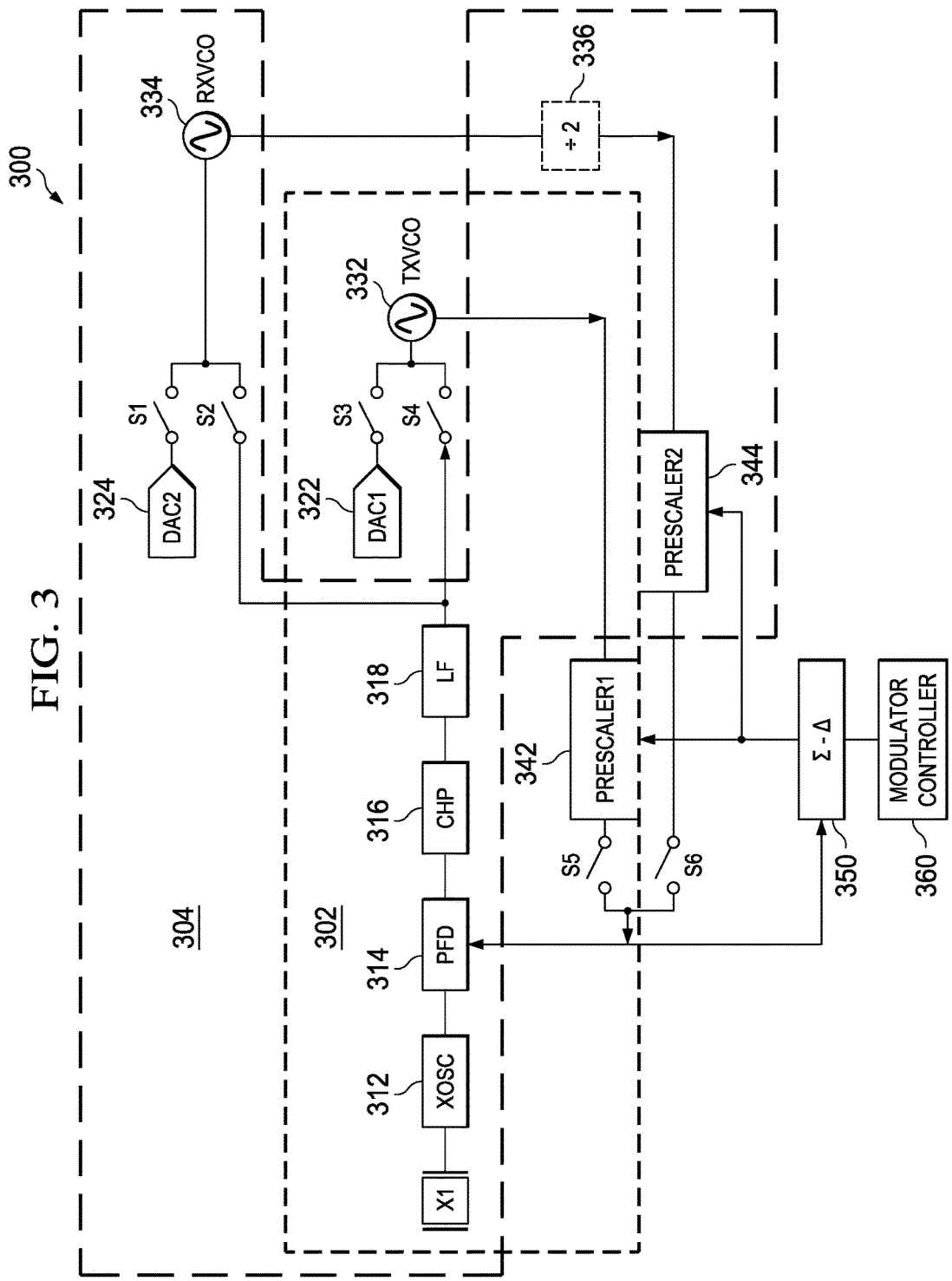
FIG. 3 is a schematic diagram illustrating a self-calibrating shared-component dual frequency synthesizer in accordance with example embodiments of the disclosure.

FIG. 3 is a schematic diagram illustrating a self-calibrating shared-component dual frequency synthesizer in accordance with example embodiments of the disclosure. The multiple frequency generator 300 includes dual frequency synthesizers (e.g. PLLs) having a common feedback portion that is coupled to at least one shared low frequency generation component. The dual frequency synthesizers include a transmit PLL 302 and a receive PLL 304, where the transmit PLL 302 and a receive PLL 304 both share (relatively) low frequency generation components. The low frequency generation components include (at least one of) a crystal X1, a crystal oscillator (XOSC) 312, a phase frequency detector (PFD) 314, a charge pump (CHP) 316, and a loop filter (LF) 318. (Thus the low frequency generation and phase/frequency processing components are arranged together as a low frequency generator.) The low frequency generation components are adapted to be adjusted under software control for operating in different test/calibration modes, as discussed below.

Each of the low frequency generation components generally occupies a substantially large layout area. (A substantially large layout area is, for example, an area that, if duplicated, would result in a noticeable cost in an integrated circuit containing the duplicated circuitry.) Thus, the sharing by the dual frequency synthesizers 300 of the low frequency generation components reduces the area and cost of an integrated circuit that includes the dual frequency synthesizers 300.

The crystal X1 (e.g., of the low frequency generation components) is arranged in conjunction with the crystal oscillator (XOSC) 312 to provide a relatively low frequency (such as 48 MHz) signal that is input to the phase frequency detector 314. The phase frequency detector 314 is arranged to stabilize and/or control the input signal in response to one or more feedback signals provided by sigma-delta modulator 350 and one of divider circuits 342 and 344. For example, the phase frequency detector 314 can adjust the phase of the input signal so that the phase of the input signal matches a phase of a phase reference signal such as a feedback signal that is selected by a switch as described below.

The charge pump 316 is arranged to generate a charge in response to the phase difference that exists between the input signal and a phase reference signal. Typically the generated charge varies linearly with a phase difference between the input signal and the phase reference signal. The amount of charge generated for a given input is controlled by programming current via software execution (for example) and is used to help tune the output of the low frequency generation components. The generated charge is converted to a voltage by an on-chip passive filter network and supplied as an (e.g., frequency) input signal to the loop filter 318.

The loop filter 318 is, for example, a low pass filter that accepts a current from the charge-pump that is proportional to the phase difference between the reference clock and the VCO clock, and generates a voltage proportional to the phase difference. The generated voltage represents the "error signal" which is then passed on to the VCO to generate the desired carrier frequency. The loop filter 318 provides spectral shaping of the "phase noise" from the phase locked loop, and is also responsible for determining the settling time of the PLL.

Switches S1, S2, S3, S4, S5, and S6 operate in response to control circuitry (such as control circuit 240) so that (e.g., in various modes) the transmit voltage controlled oscillator (TXVCO) 332 or the receive voltage controlled oscillator (RXVCO) 334 can operate in an open or closed loop configuration. It is understood that the switches can be represented as a single component (e.g., multiplexer) or separate components. Thus, the switches are not necessarily implemented as entirely physically separate components and can be implemented using transistors having structures that are shared between two or more of the switches S1-S6.

For example, the output of the loop filter 318 can be coupled to the input of the transmit voltage controlled oscillator (TXVCO) 332 via switch S4. Likewise the output of the loop filter 318 can be coupled to the input of the receive voltage controlled oscillator (RXVCO) 334 via switch S2. Thus, the TXVCO 332 can be driven responsive to the loop filter 318 (via switch S4 so that the PLL 302 operates in a closed-loop mode) or a first digital-to-analog converter (DAC1) via switch S3 (so that the PLL 302 operates in an open-loop mode). The RXVCO 334 can be driven responsive to the loop filter 318 (via switch S2 so that the PLL 304 operates in a closed-loop mode) or a second digital-to-analog converter (DAC2) via switch S1 (so that the PLL 304 operates in an open-loop mode). In the open-loop mode, the on-chip VCOs typically need to be stabilized over a short period of time (usually of the order of 50-100 μseconds such that the functionality used for calibration can be provided.

Because the transmit PLL 302 and the receive PLL 304 use separate VCOs (e.g., TXVCO 332 and RXVCO 334, respectively), the routing capacitance between each PLL and the signal chain blocks (e.g., the transmit PA 232 and the RX mixer 212) can be resonated by the inductance of the resonator tanks of the respective VCO without any substantial (e.g., noticeable) impact on the tuning range or the phase noise associated with a VCO, and can be dynamically controlled by switching capacitors by software control. The transmit PLL 302 and the receive PLL 304 may also be individually programmed for widely different bandwidths using software to achieve fast/slow settling times. This allows for the separate optimization of the PLL loop-bandwidth (e.g., in the cases of transmitting, receiving and calibration) to meet the requirements of spectral fidelity and settling times respectively. For example, the charge pump 314 can be programmed (e.g., using programming registers) to selectively change the amount of charge that is produced for a given phase difference (thus changing the bandwidth of the selected PLL). Likewise, the loop filter 318 can be programmed (e.g., using programming registers) to change the capacitance. Changing the capacitance and the current bias allows wide programmability of the PLL loop-bandwidth and the associated settling time. Selectively resonating the output node of the low frequency generation components in accordance with a selected VCO (e.g., either TXVCO 332 or RXVCO 334) provides substantial flexibility in integrated circuit floor-planning (and/or high frequency signal routing) to mitigate electromagnetic coupling between net segments and to achieve low power consumption.

For purposes of establishing feedback signals used in transmit PLL 302 or receive PLL 304, a feedback circuit is provided. For example, the outputs of TXVCO 332 and RXVCO 334 are respectively coupled to a first divider circuit (PRESCALER1) 342 and a second divider circuit (PRESCALER2) 344. The feedback dividers can be fully implemented using CMOS logic to reduce substrate area requirements. One of switches S5 or S6 can be closed (e.g., to couple a signal) in order to select the output of one of the first divider circuit 342 and the second divider circuit 344 as the reference signal from which either or both of the TXVCO 332 and RXVCO 334 are controlled.

Because the output of RXVCO 334 is typically higher than the frequency of the output of TXVCO 332, (optional) divider 336 is arranged, for example, to divide the frequency of the output of RXVCO 334 by a value of two. Dividing the frequency of the output of RXVCO 334 by a value of two can make the input of the mixer 212 approximately equal to the frequency of the frequency of the output of TXVCO 332 (e.g., assuming the frequency of the output of RXVCO 334 is around twice the frequency of the output of TXVCO 332).

Thus the first divider circuit 342 and the second divider circuit 344 can be designed having similar layouts, similar critical paths, similar frequencies, similar areas, and the like, which enhances performance capabilities. Likewise, the outputs of the first divider circuit 342 and the second divider circuit 344 reduce the higher frequencies output by the TXVCO 332 and the RXVCO 334 to frequencies that are compatible (e.g., having a sufficiently low frequency) with the input of the phase frequency detector 314.

The phase lock loops 302 and 304 are independent phase lock loops that can be (respectively or alternately) be operated an open or closed loop mode wherein the PLL of the closed loop is controlled using a common feedback signal. The common feedback signal is selected from one of the two (e.g., PLL 302 and PLL 304) phase lock loops using switches S1-S6. As described above, the selected output is provided as a control input to the phase frequency detector 314 via switch S5 or S6.

In other embodiments (not shown), one or more additional PLLs (e.g., so that more than PLLs 302 and 304) can be commonly synchronized. The one or more additional PLLs can be commonly synchronized by adding additional reference frequency input switches (similar to S1 and S2), a VCO (similar to VCO 340), a divider circuit (similar to second divider circuit 344), and a common feedback selector switch (similar to switch S6). The additional PLLs can each be used to inject an additional signal tone into a frequency used for testing (as described below with reference to FIG. 4). The additional PLLs (including duplicative low frequency components used for the additional PPLs) can be of lower quality than the PLL 302 and 304 and used, for example, to generate signals used for calibration and test.

The divider circuits 342 and 344 are controlled in response to control circuitry (such as a microprocessor and/or control circuit 240) to load a divisor (e.g., digital value) used in fractional-N feedback loops. The control circuitry includes circuitry such as sigma-delta ($\Sigma$-$\Delta$) controller 350 and modulator controller 360. The sigma-delta ($\Sigma$-$\Delta$) controller 350 and the modulator controller 360 are used in fractional-N feedback loops to enhance resolution of the output frequency of the TXVCO 332 and RXVCO 334 by jittering the frequency of the selected feedback signal. Accordingly, the sigma-delta ($\Sigma$-$\Delta$) controller 350 and the modulator controller 360 are used to minimize sideband components of the frequency outputs of the TXVCO 332 and RXVCO 334.

The two independent PLLs 302 and 304 include independent blocks (e.g., VCOs 332 and 334 as well as the divider circuits 342 and 344) that operate at higher frequencies than the low frequency generation components. The common portion between the PLLs 302 and 304 are selectively coupled (e.g., multiplexed via switches S1-S6) to the independent blocks and the divider circuits used to feedback the outputs of the VCOs 332 and 334. The multiplexing substantially reduces the transceiver power because, for example, the multiplexing occurs at low frequency points of each PLL, and thus the switches used to multiplex do not add impedance loads to the high frequency portions of the PLLs 302 and 304. (A substantial difference in power consumption results in, for example, a noticeable difference in operating times or noticeably cooler junction temperatures within the IC.)

During a calibration phase, the switches S1-S4 are variously configured to couple a DAC output to the control lines of the VCOs 332 and 334. For example, in a TX PLL 302 calibration phase, switches S3 and S5 are closed (while switch S4 is open). When switches S3 and S5 are closed, a first DAC 322 drives a control line of TXVCO 332, and the feedback signal sourced by TXVCO 332 is input to the phase-frequency detector 314. Accordingly, the PLL 302 is operating in an open loop mode.

After the calibration phase and a normal mode of transmit (TX) operation is entered, switches S4 and S5 are closed (and switch S3 opened), which couples (via switch S4) the output of the loop filter 318 to the control line input of the of TXVCO 332, and which couples (via switch S5) the output of the divider circuit 342 to the control input of the phase frequency detector 314. In this TX mode, the PLL 302 is operating in a closed loop mode.

Likewise, in a RX PLL 304 calibration phase, switches S1 and S6 are closed (and switch S2 is open). When switches S1 and S6 are closed (and switch S2 is open), a second DAC 324 drives a control line of RXVCO 334, and the feedback signal sourced by RXVCO 334 is input to the phase-frequency detector 314. Accordingly, the PLL 304 is operating in an open loop mode.

After the calibration phase and a normal mode of receive (RX) operation is entered, switches S2 and S6 are closed (and switch S1 is open), which couples (via switch S2) the output of the loop filter 318 to the control line input of the RXVCO 334, and which couples (via switch S6) the output of the divider circuit 344 to the control input of the phase frequency detector 314. In this RX mode, the PLL 304 is operating in a closed loop mode In various low power applications, modulation is typically provided in phase or frequency, although amplitude modulation can also be used. In a phase/frequency modulation system, a transmitter (such as transmitter 230) can be implemented using a single point injection node to provide phase/frequency modulation. In a transmission mode that uses phase and/or frequency modulation, the feedback division ratio (e.g., M/N, where M is a selected frequency harmonic and/or multiple of XOSC 312, and where N is a divisor in divider circuit 342) is automatically and dynamically changed by the delta-sigma modulator 350. In a transmission mode that uses amplitude modulation, the transmitter is typically arranged to modulate the output signal using the power amplifier (e.g., PA 232) using clock signals generated using the (fractional-N) PLL 302. In typical operating modes, generally only one PLL 302 or 304 is activated at a time while respectively transmitting and receiving during time-division duplexing.

Before entering an operational mode (such as when actual transmission and/or reception occurs), the two PLLs 302 and 304 can be independently calibrated to determine the frequency characteristics of each PLL. Independent calibration is typically performed at power up of the chip (e.g., as part of a confidence test that is performed in response to a powering-up of an integrated circuit that includes the substrate in which the transmit PLL 302 and a receive PLL 304 are formed). One or both of the PLLs 302 and 304 can be can also be calibrated at other times (such as pauses during normal operation, where a calibration is performed during a pause that occurs before transmitting a packet via an "air" transmission).

After the calibration, the frequency curves of each PLL are determined (using DSP engine 224, for example. A frequency curve can be a linear function that is determined (e.g., as a metric using measurements that are made) over a range of frequencies. After the frequency curve is determined, the two VCOs 332 and 334 can be driven by (e.g., locked to) the same on-chip crystal oscillator 312 (which is a shared low frequency generation component) as discussed below with reference to FIG. 4.

Figure 4:
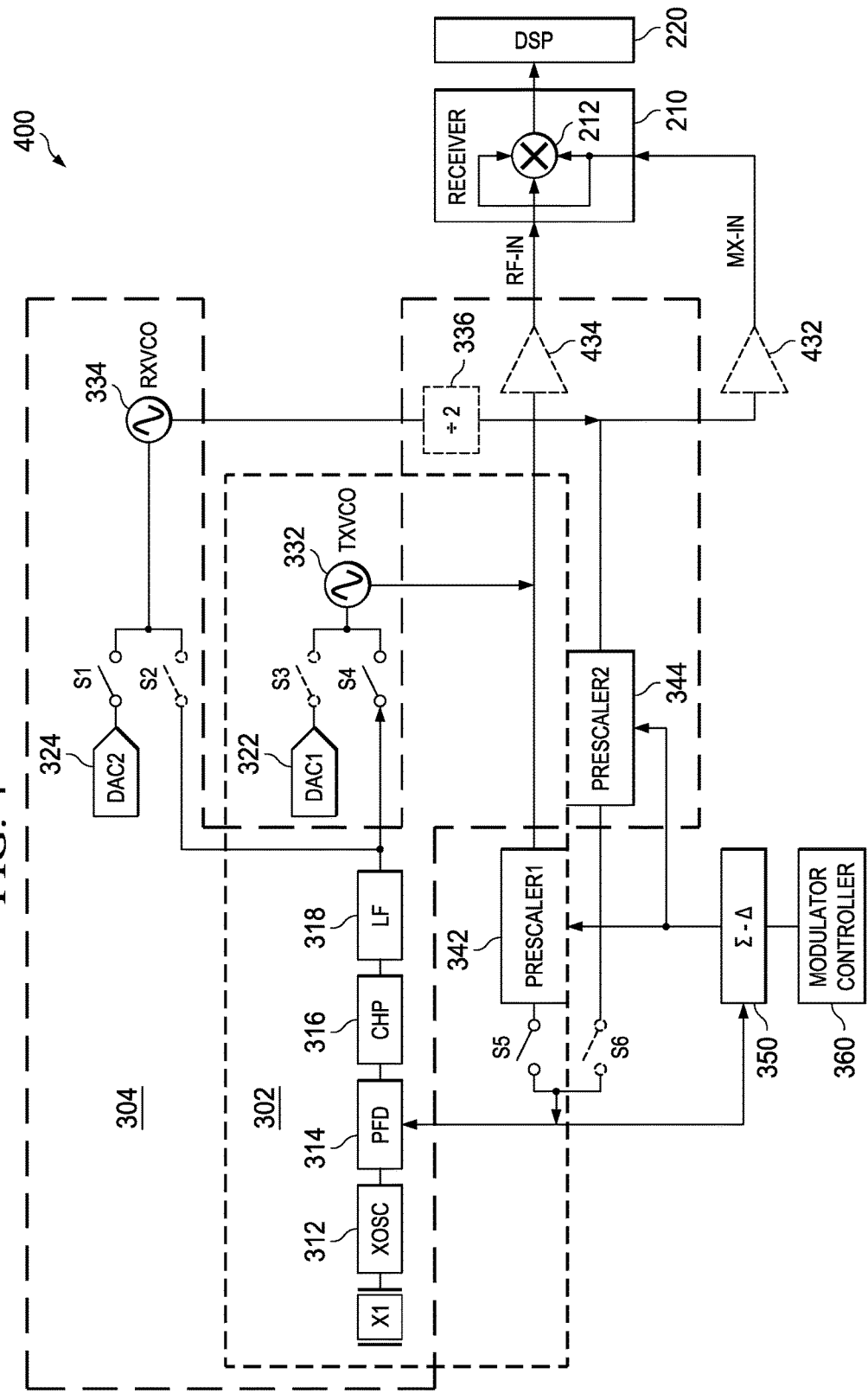
FIG. 4 a schematic diagram illustrating the self-calibrating shared-component dual frequency synthesizer of FIG. 3 configured for a single tone and/or two-tone generation/calibration phase in accordance with example embodiments of the disclosure.

FIG. 4 a schematic diagram illustrating the self-calibrating shared-component dual frequency synthesizer of FIG. 3 configured for a single tone and/or two-tone generation/calibration phase in accordance with example embodiments of the disclosure. Self-calibrating shared-component dual frequency synthesizer 400 is a self-calibrating shared-component dual frequency synthesizer 300 that is arranged to perform a self-calibration that includes two-tone generation of signals that are measured.

As an example of a self-calibration of self-calibrating shared-component dual frequency synthesizer 400 that includes two-tone generation, the TX VCO 332 is arranged (e.g., switches S4 and S5 are closed while switches S3 and S6 remain open) to generate the feedback signal for "locking" the PLL 302, while the RX VCO 334 is programmed to a known (and/or predetermined) frequency (e.g., using second DAC 324). The RX VCO 334 and the TX VCO 332 can each be operated using a separate different supply voltage (each of which can be selectively and independently applied as discussed above with respect to power domain controller 250), while both can alternately be locked to the on-chip crystal oscillator.

In a two-tone generation calibration test, the modulator controller 360 dynamically programs the selected (fractional-N) feedback dividers of a selected PLL to provide the modulation used in binary FSK (frequency-shift keying). For example, selected feedback dividers (e.g., selected via switch S5 or S6) are programmed with values that correspond to specific frequencies and/or "tones" to generate (e.g., for emulation purposes) an output signal having a binary FSK modulation. The binary FSK modulation is generated by shifting (e.g., sweeping) the frequency of the output signal (as "locked" by the feedback signal selected via switch S5 or S6) between two closely spaced (e.g., predetermined) tones.

The FSK-modulated output signal may be coupled to any high frequency interface of the front-end including the input (RF-IN) (e.g., receiver 210 including mixer 212) to measure the effects of the received two tone signal upon the entire receiver (e.g., receiver 210) or on a block-by-block basis. The effects can be measured, for example, using the DSP engine 224 to perform a spectral analysis of each of a series of time slices (e.g., where each time slice is 1024 samples) using fast Fourier transforms (FFTs). Accordingly, the spectral characteristics can be measured over time such that the frequency response of the system can be determined at various points in time to, for example, to determine whether the system is operating within specifications. Since the intermodulation performance is a function of the bias current/voltages of the blocks, they can be adjusted by software control if the BISC provides a result that is outside the desired range of such parameters.

In the two-tone calibration test mode, the RXVCO 334 can be programmed to generate a second frequency that has a frequency different from the first frequency generated by the TXVCO 332. Where the RXVCO 334 is arranged to generate frequencies approximately two times higher than the TXVCO 332 output frequencies, the frequency divider 336 is used to divide the output frequency of the RXVCO 334 using a divider-by-two (so that, for example, the quadrature input MX-IN signal is within a factor of two of the RF-IN signal). The output of the mixer 212 is a baseband output that is coupled to the baseband/low frequency signal processing elements 220 for the spectral analysis. Because the baseband/low frequency signal processing elements 220 are locally placed (e.g., in the radio 200), the baseband/low frequency signal processing elements 220 can be used to perform locally computed calibration tests and routines.

The two-tone calibration test as disclosed herein can substantially reduce or eliminate the need for expensive external components used to conduct an intermodulation test, which usually require two signal generators and a combiner apparatus off-chip (e.g., not included in the substrate of the disclosed device). (A substantial simplification is a simplification that results in a noticeable difference in the cost of test of the integrated circuit that includes a receiver, whether the costs are apportioned over the external equipment, the cost of the area on the substrate devoted primarily for test, or both.)

Where loading conditions (e.g., for each different design including the two-tone calibration capability as disclosed herein) prevent sufficiently high operating bandwidths, the linear buffers 432 and 434 can be provided at design time to drive the additional load presented by coupling the outputs of the VCOs to the RF-IN and the MX-IN inputs of the receiver 210.

Figure 5:
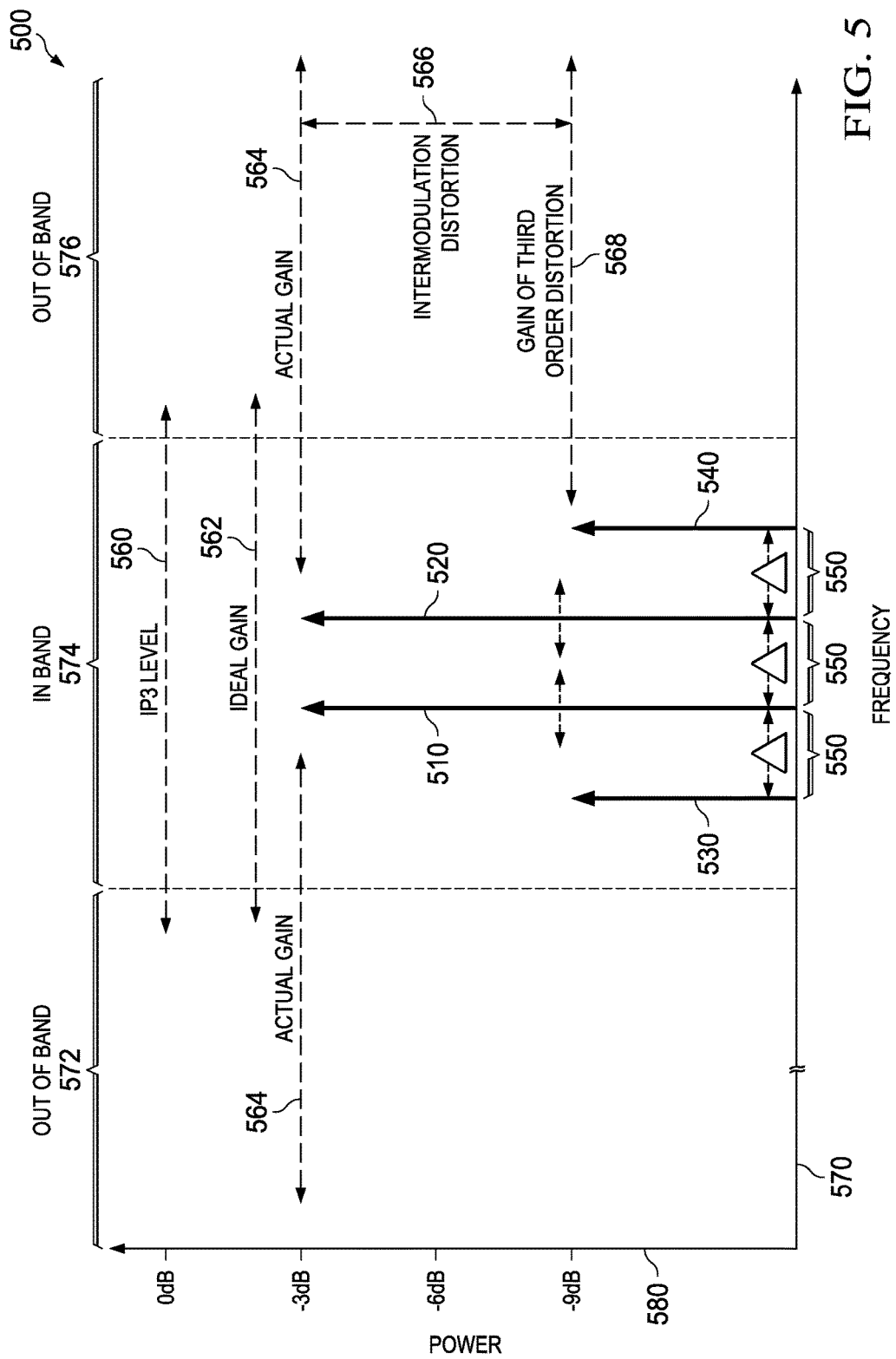
FIG. 5 is a graph diagram of a spectral illustration for intermodulation calibration of an amplifier using self-calibrating shared-component dual frequency synthesizers in accordance with example embodiments of the disclosure.

FIG. 5 is a graph diagram of a spectral illustration for intermodulation calibration of an amplifier using self-calibrating shared-component dual frequency synthesizers in accordance with example embodiments of the disclosure. Graph 500 includes a vertical axis 580 (representing power output in decibels (dB)) and a horizontal axis 570 (representing frequency). The horizontal axis can be divided in accordance with in-band frequency range 572 and out-of-band frequency ranges 272 and 576. The in-band frequency range 574 is typically sufficiently wide enough to capture the third order intermodulation distortion components 530 and 540 that result from intermodulation of the two tones 510 and 520, while yet is sufficiently narrow to exclude the second order intermodulation components (e.g., that occur at frequencies greater than twice the frequency of tone 510).

Frequency delta 550 is the difference in frequency between ton 510 and 520. The magnitude of frequency delta can be changed by changing the frequency (e.g., lower or higher) at least one of the tones 510 and 520. The third order intermodulation components 530 and 540 are respectively separated from tones 510 and 520 by frequency delta 550. Accordingly the third order intermodulation components 530 and 540 and the tones 510 and 520 fall within the in-band frequency range 574.

The spacing between two tones used in the two-tone test can be varied by changing the Δ-Σ 350 modulator programming and can be flexibly programmed to perform in band or out-of band two tone testing. The down-converting tone (e.g., quadrature signal) derived from the second VCO can be adjusted so that the mixer 212 output signal can be processed within the maximum frequency at which the ADC 222 can perform accurate conversions.

The third order distortion gain 568 of the (e.g., amplifier's response in generating) the third order intermodulation components 530 and 540 is illustrated as −9 dB (e.g., for the purpose of simplicity of illustration), while the actual gain 564 of the tones 510 and 520 is illustrated as being −3 dB. The ideal gain 562 of the amplifier is illustrated as being −2 dB, which indicates the point at which the actual gain 564 differs from the ideal gain 562 by 1 dB.

Because the actual gain 562 differs from the ideal gain 562, intermodulation distortion 566 is introduced. The magnitude of the intermodulation distortion 566 is the difference between the actual gain 564 and the third order distortion gain 568 (e.g., which is the magnitude of the third order intermodulation components 530 and 540). The IP3 (third order intercept point) 560 is illustrated as having a power level of 0 dB. The IP3 level can be computed by dividing the intermodulation distortion 566 by two and adding the quotient to the actual gain 564.

The dynamic range of the two tone measurement is governed by three aspects: the spectral fidelity of the on-chip VCOs, which determines with what quality the two distinct tones can be generated, and the dynamic range of the ADC, which determine the IP3 measurement values that are achievable, and the separation between the two tones (e.g., usually kept at 1-2 MHz). All of these metrics substantially influence the power consumption in the individual circuit blocks (such as each VCO that is used to a generate measurement signal). Accordingly, each VCO (and the circuitry paired with each VCO) can consume higher levels of power to enhance the quality of measurements performed during testing and calibration. During the normal operation, however, each VCO can be separately programmed (e.g., using the power domain controller 250) to operate at lower power levels as required by the targeted communication standard of a particular application or operating mode.

Figure 6:
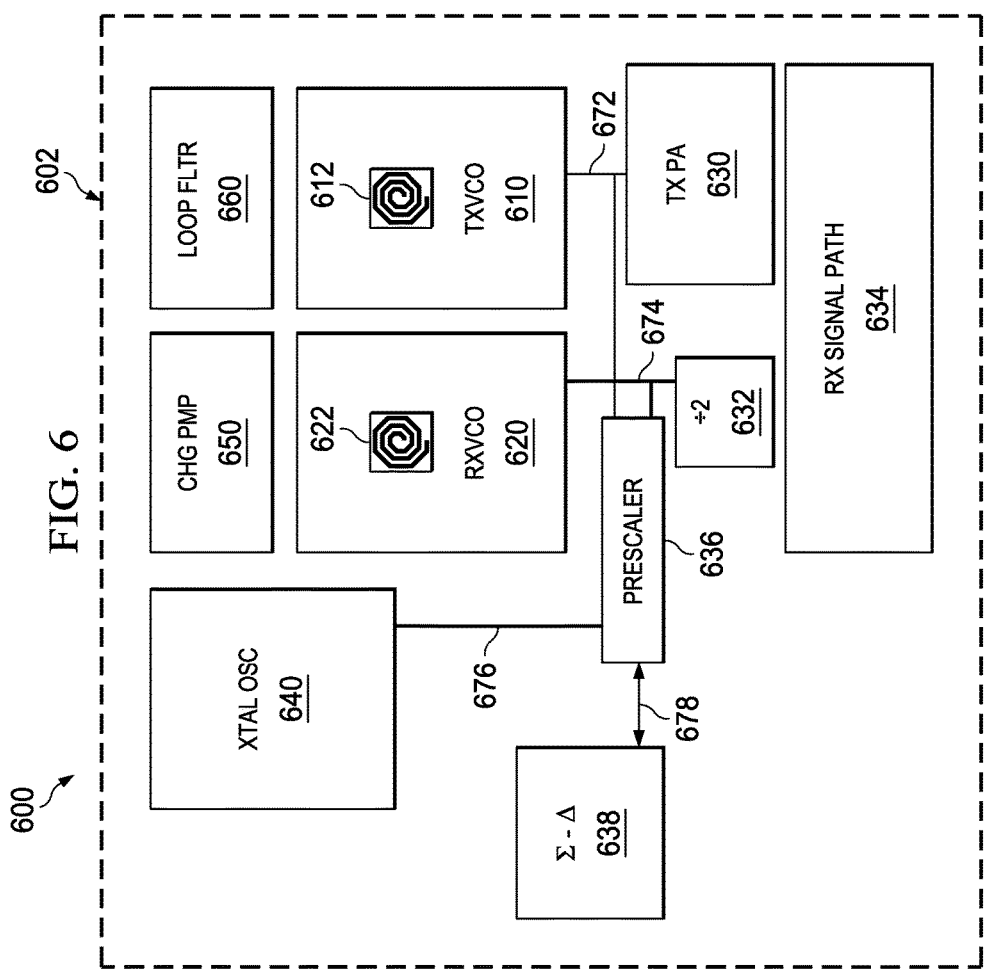
FIG. 6 is a layout diagram of a floorplan of a self-calibrating shared-component dual frequency synthesizer system in accordance with example embodiments of the disclosure.

FIG. 6 is a layout diagram of a floorplan of a self-calibrating shared-component dual frequency synthesizer system in accordance with example embodiments of the disclosure. The example self-calibrating shared-component dual frequency synthesizer system 600 includes a substrate 602 in which the components of the self-calibrating shared-component dual frequency synthesizer system 600 are arranged. The components of the self-calibrating shared-component dual frequency synthesizer system 600 are arranged in such a way as to optimize integrated circuit design considerations such as reduced area of the floorplan, higher operating frequencies, cost, increased life span, and the like.

The components of the self-calibrating shared-component dual frequency synthesizer system 600 are arranged using a spatial arrangement of the dual synthesizers that provides reduced electromagnetic cross-talk. Signal lines 672, 674, 676, and 678 illustrate high frequency clock signal routing (e.g., as compared to low frequency signals) and thus special care is taken to, for example, minimize the length of the transmission path of each signal. The signal lines 672, 674, 676, and 678 are typically differential in nature (e.g., to reduce common mode interference), and can use twisted pair methodology to further reduce electromagnetic cross-talk.

Substrate 602 includes TX VCO block 610 (which includes inductor 612) and TX PA block 630, which are placed in close proximity of (e.g., adjacent to) each other. TX VCO 610 and TX PA 630 are both used for TX mode (as well as calibration mode) and are thus situated adjacent to each other.

Substrate 602 also includes RX VCO block 620 (which includes inductor 622), divide-by-two ("÷2") block 632, and prescaler block 636, all of which are placed in close proximity of (e.g., adjacent to) each other. The RX VCO block 620 and divide-by-two block 632 are both used for RX mode (as well as calibration mode) and are thus situated adjacent to each other.

The divide-by-two block 632 is considered to be adjacent to the RX VCO block 620 (notwithstanding, for example, the partial interposition of the prescaler block 636) because the adjacent pair of blocks are arranged without having a block different from the pair of adjacent blocks interposed between at least a portion of each block in the respective pair of adjacent blocks. For example, the area of signal line 674 illustrates an area in which no other block interposes between a portion of the divide-by-two block 632 and a portion of the RX VCO block 620. The divide-by-two block 632 is a broadband (e.g., high frequency and not low frequency) block that is, in turn, arranged to be in close proximity to the actual RX mixer (e.g., mixer 212) that is included in the RX signal path block 634.

The prescaler block is further arranged to be in close proximity to the crystal oscillator (XTAL OSC) block 640 and the sigma-delta modulator block 638. The crystal oscillator block 640 is arranged to provide a master time base signal (e.g., master clock signal), while the sigma-delta modulator block 638 is arranged to digitally control a division ratio of the prescaler block 636.

The charge-pump (CHG PMP) block 650 is arranged to be in close proximity (e.g., adjacent) to the TX VCO block 610, to the RX VCO block 620, and to the loop filter (LOOP FLTR) block 660. The loop filter (LOOP FLTR) block 660 is arranged to be in close proximity (e.g., adjacent) to the TX VCO block 610, to the RX VCO block 620, and to the charge-pump (CHG PMP) block 650. The charge-pump (CHG PMP) block 650 and the loop filter block 660 are shared between the two synthesizers (e.g., TX VCO block 610 and the RX VCO block 620) and thus are arranged to be in close proximity to the two synthesizers (as well as to each other). The charge-pump (CHG PMP) block 650 and the loop filter block 660 are programmable for achieving a desired (e.g., selected) loop-bandwidth of the PLL self-calibrating shared-component dual frequency synthesizer system 600 in each mode (e.g., the TX, RX, and calibration modes).

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. An oscillator circuit, comprising:
a first oscillator for generating a first output frequency signal in response to a control frequency signal;
a second oscillator for generating a second output frequency signal in response to the control frequency signal;
a low frequency generator for generating the control frequency signal; and
a feedback circuit for generating a feedback signal in response to a selected one of the first output frequency signal and the second output frequency signal and for coupling the feedback signal to a control input of at least one low frequency generator component of the low frequency generator, wherein the control frequency signal is generated in response to the coupled feedback signal;
a first switch for selectively coupling an output of a first digital-to-analog converter (DAC) to a control input of the first oscillator, comprising a second switch for selectively coupling the control frequency signal to the control input of the first oscillator, comprising a third switch for selectively coupling an output of a second DAC to a control input of the second oscillator, and comprising a fourth switch for selectively coupling the control frequency signal to the control input of the second oscillator, and wherein the second output frequency signal is generated simultaneously as the first output frequency signal in a calibration mode.

2. The circuit of claim 1, wherein the feedback signal is selected by closing exactly one of a fifth switch and a sixth switch, wherein the fifth switch is arranged to selectively couple a first divider output of a first divider that has an input that is coupled to the second output frequency signal, and wherein the sixth switch is arranged to selectively couple a second divider output of a second divider that has an input that is coupled to the first output frequency signal and a divided first output frequency signal.

3. The circuit of claim 2, wherein the second divider is coupled to the first output frequency signal via a third divider operable to reduce the frequency of the first output frequency signal.

4. The circuit of claim 3, wherein the first, second, third, fourth, fifth, and sixth switches are for switching signals having frequencies lower than the first and second output frequency signals.

5. The circuit of claim 1, wherein the first oscillator is arranged to operate in a closed loop mode where the control input of the first oscillator is arranged to receive the control frequency signal and the feedback signal is generated in response to the first output frequency signal, and wherein the second oscillator is arranged to operate in an open loop mode where the control input of the second oscillator is arranged to receive the output of the second DAC and the feedback signal is generated in response to the first output frequency signal, wherein the first output frequency signal is coupled to a receiver, and wherein the second output signal is coupled to a transmitter.

6. A phase-locked loop (PLL) system, comprising:
a first oscillator that is arranged to generate a first output frequency signal in response to a first oscillator control signal, wherein the first oscillator is selectively activated in a transmission mode and a calibration mode;
a second oscillator that is arranged to generate a second output frequency signal in response to a second oscillator control signal, wherein the second oscillator is selectively activated in a receive mode and the calibration mode, wherein the second oscillator is simultaneously active with the first oscillator in the calibration mode;
a low frequency generator that is arranged to generate a control frequency signal that is used to generate one of the first output frequency signal and the second output frequency signal; and
a feedback circuit that is arranged to select, during the calibration mode, one of the first output frequency signal and the second output frequency signal, to generate a feedback signal in response to the selected select one of the first output frequency signal and the second output frequency signal, and to couple the feedback signal to a control input of at least one low frequency generator component of the low frequency generator, wherein the control frequency signal is generated in response to the coupled feedback signal.

7. The device of claim 6, wherein the first oscillator is coupled to a transmitter power amplifier in the transmission mode, and wherein the second oscillator is coupled to a divider circuit that is arranged to generate quadrature signals for a receiver mixer in the calibration mode.

8. The device of claim 7, wherein the first oscillator is arranged as a first block in a substrate, the power amplifier is arranged as a second block in the substrate adjacent to the first block, the second oscillator is arranged as a third block in the substrate adjacent to the first block, the divider circuit is arranged as a fourth block in the substrate adjacent to the third block, and a feedback divider circuit is arranged as a fifth block in the substrate adjacent to the fourth block, wherein each pair of adjacent blocks is arranged without having a block different from the pair of adjacent blocks interposed between at least a portion of each block in the respective pair of adjacent blocks.

\* \* \* \* \*